(12) United States Patent
Hone et al.

(10) Patent No.: US 10,411,654 B2
(45) Date of Patent: Sep. 10, 2019

(54) AMPLIFIER AND TRANSMITTER

(71) Applicant: KABUSHIKI KAISHA TOSHIBA, Minato-ku (JP)

(72) Inventors: Thomas Martin Hone, Yokohama (JP); Atsushi Yamaoka, Yokohama (JP); Keiichi Yamaguchi, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/906,191

(22) Filed: Feb. 27, 2018

(65) Prior Publication Data

US 2019/0089312 A1 Mar. 21, 2019

(30) Foreign Application Priority Data

Sep. 20, 2017 (JP) .................. 2017-180690

(51) Int. Cl.
*H03F 1/02* (2006.01)
*H03F 3/195* (2006.01)
*H03F 3/213* (2006.01)
*H04B 1/04* (2006.01)

(52) U.S. Cl.
CPC .......... *H03F 1/0288* (2013.01); *H03F 3/195* (2013.01); *H03F 3/213* (2013.01); *H04B 1/04* (2013.01); *H03F 2200/387* (2013.01); *H03F 2200/423* (2013.01); *H03F 2200/451* (2013.01); *H04B 2001/0408* (2013.01)

(58) Field of Classification Search
CPC ............. H03F 1/0288; H03F 2200/387; H03F 2200/451; H03F 3/195; H03F 3/68; H03F 1/56; H03F 2200/39; H03F 3/602; H03F 1/02; H01L 2224/49175

USPC ......................................................... 375/297
See application file for complete search history.

(56) References Cited

U.S. PATENT DOCUMENTS 8,022,760 B2 9/2011 Gajadharsing et al.
2004/0113697 A1\* 6/2004 Pengelly ................. H01L 23/66
330/295

(Continued)

OTHER PUBLICATIONS

W. C. Edmund Neo et al. "A Mixed-Signal Approach Towards Linear and Efficient N-Way Doherty Amplifiers," IEEE Transactions on Microwave Theory and Techniques, vol. 55, No. 5, 2007, pp. 14.

(Continued)

*Primary Examiner* — Leila Malek
(74) *Attorney, Agent, or Firm* — Oblon, McClelland, Maier & Neustadt, L.L.P.

(57) ABSTRACT

An amplifier has an N number of input networks connected to an input terminal to receive an input signal, a first amplifier to amplify one output signal from the N number of input networks, a (N−1) number of secondary amplifiers to amplify the remaining (N−1) number of output signals, except for the one output signal, from the N number of input networks, where the amplification order of the (N−1) number of secondary amplifiers is determined based on the power level of each output signal from the N number of input networks when the first amplifier is operational, an N number of output networks which are arranged, and a first bias network to supply a D.C. bias voltage to at least one of the N number of output networks. An electrical length of the first bias network is less than 90 degrees.

18 Claims, 11 Drawing Sheets

(56) References Cited

U.S. PATENT DOCUMENTS

2013/0027272 A1\* 1/2013 Karthaus ................ H01Q 1/246
                                                    343/850
2014/0035681 A1\* 2/2014 Boumaiza ........... G06F 17/5068
                                                    330/295
2016/0373085 A1\* 12/2016 Barbieri ............ H01L 23/49822

OTHER PUBLICATIONS

Jingchu He, et al. "A 500-W High Efficiency LDMOS Classical Three-way Doherty Amplifier for Base-Station Applications," IEEE International Microwave Symposium, 2016, pp. 4.

Ayushi Barthwal et al. "Bandwidth Enhancement of Three-Stage Doherty Power Amplifier Using Symmetric Devices," IEEE Transactions on Microwave Theory and Techniques, vol. 63. No. 8. 2015. pp. 12.

Hamed Golestaneh et al. "An Extended-Bandwidth Three-Way Doherty Power Amplifier," IEEE Transactions on Microwave Theory and Techniques, vol. 61, No. 9 , 2013, pp. 11.

\* cited by examiner

AMPLIFIER AND TRANSMITTER

CROSS REFERENCE TO RELATED APPLICATIONS

This application is based upon and claims the benefit of priority from the prior Japanese Patent Application No. 2017-180690, filed on Sep. 20, 2017, the entire contents of which are incorporated herein by reference.

FIELD

Embodiments relate to an amplifier and a transmitter.

BACKGROUND

A Doherty amplifier, which dynamically changes the number of amplifiers in accordance with the amplitude of a high-frequency input signal, is known. The Doherty amplifier is configured with one main amplifier and one or more number of peak amplifiers. A Doherty amplifier having an N number of amplifiers is referred to as an N-way Doherty amplifier. The main amplifier always operates, and the peak amplifiers operate only with great power. Although a 2-way Doherty amplifier having one peak amplifier is popular, there is a Doherty amplifier having two or more peak amplifiers. Each amplifier uses a transistor (bipolar, FET) as an amplification element.

DETAILED DESCRIPTION

According to one embodiment, an amplifier has an N number of input networks connected to an input terminal to receive an input signal;

a first amplifier to amplify one output signal from the N number of input networks, a (N−1) number (N being an integer of three or more) of secondary amplifiers to amplify the remaining (N−1) number of output signals from the N number of input networks, where the amplification order of the (N−1) number of secondary amplifiers is determined based on the power level of each output signal from the N number of input networks when the first amplifier is operational, an N number of output networks which are arranged so that a single output network exists between each output node of the N amplifiers and a common load connection node, and a first bias network to supply a D.C. bias voltage to at least one of the N number of output networks. An electrical length of the first bias network is less than 90 degrees.

Hereinafter, embodiments will be explained with reference to the drawings. In the present specification and the accompanying drawings, for easy understanding and simplicity of drawings, the explanation and the drawings are made with part of the configuration being omitted, modified or simplified. However, the technical contents to the extent that a similar function can be expected will be interpreted to be included in the embodiments.

Figure 1:
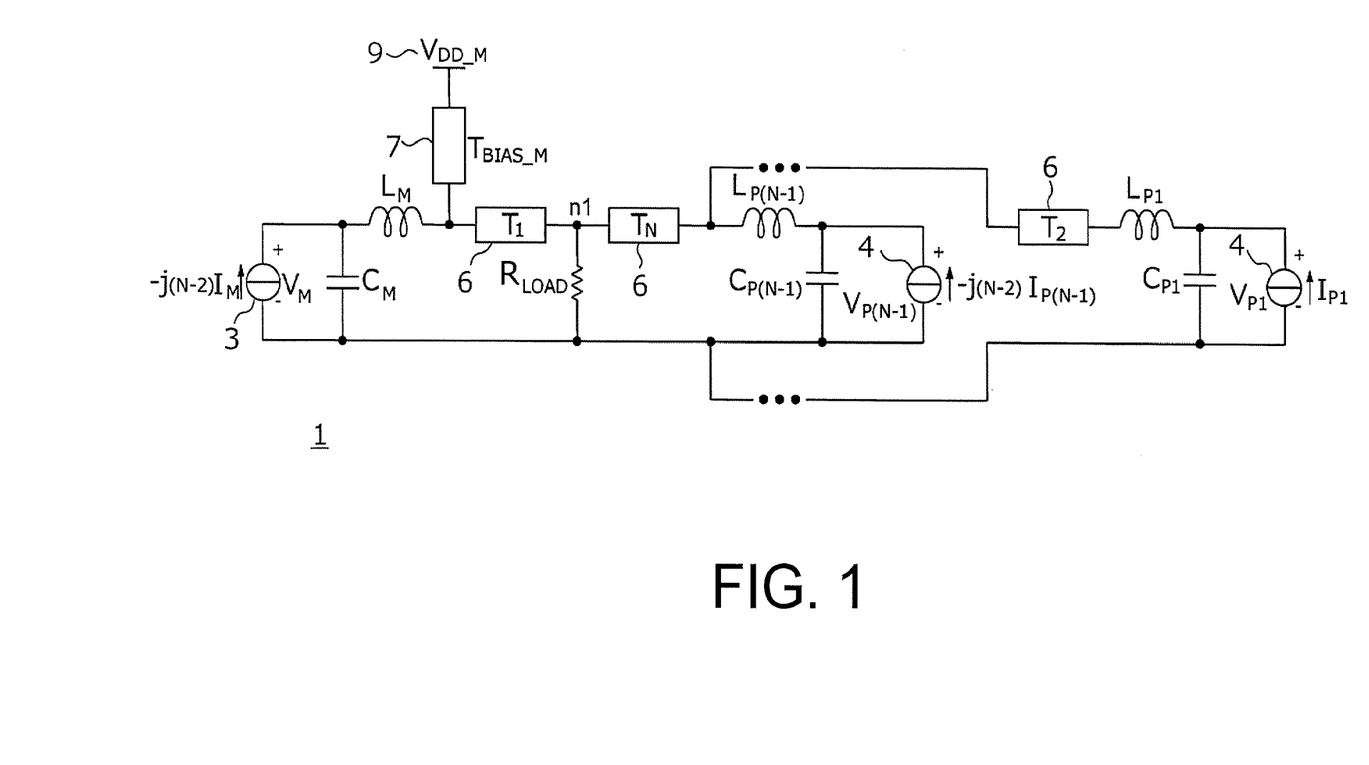
FIG. 1 is an equivalent circuit diagram of an amplifier according to an embodiment.
Figure 2:
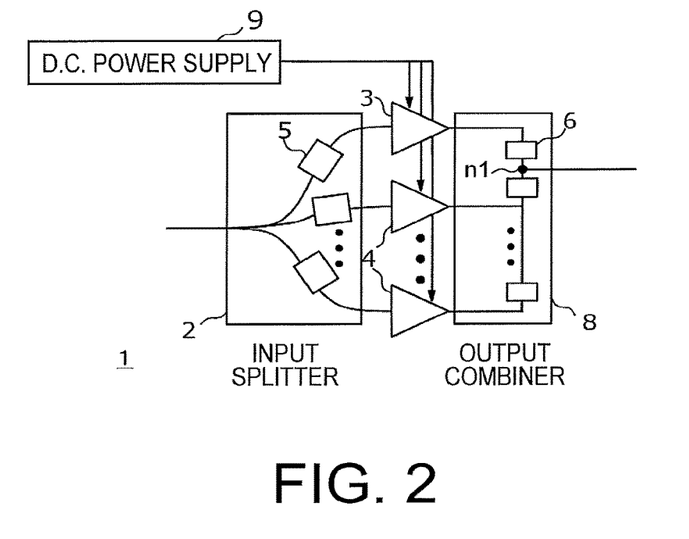
FIG. 2 is a conceptual block diagram of the amplifier of FIG. 1.

FIG. 1 is an equivalent circuit diagram of an amplifier 1 according to an embodiment. FIG. 2 is a conceptual block diagram of the amplifier 1 of FIG. 1. In both FIGS. 1 and 2, a transistor is expressed as an ideal current source. The amplifier 1 according to the present embodiment is an N-way Doherty amplifier 1 that dynamically changes the number of amplifiers in accordance with the amplitude of a high-frequency input signal. The N-way means that an N number of amplifiers are provided, N being three or more. An electrical length is the electrical length with respect to a fundamental wave, unless otherwise specified.

As shown in FIGS. 1 and 2, the amplifier 1 according to the present embodiment is provided with an input splitter 2, a main amplifier (first amplifier) 3, a (N−1) number (N being an integer of 3 or more) peak amplifiers (secondary amplifiers) 4, an N number of input networks 5, the N number of output networks 6, a first bias network 7, an output combiner 8, and a D.C. power supply 9. The main amplifier 3 and the (N−1) number of peak amplifiers 4 are connected in parallel. The input networks 5, the output networks 6, and the bias network 7 may be realized with a transmission line, lumped constant parts such as a coil and a capacitor, a waveguide, or a combination thereof. To the main amplifier 3 and each peak amplifier 4, a single D.C. voltage is supplied from the D.C. power supply 9. The single D.C. voltage is used as a bias voltage, as described later. The bias voltage is a voltage to be applied to a drain in the case of an FET, whereas to a collector in the case of a bipolar transistor. As described, one unique point is biasing with a single D.C. voltage.

The main amplifier 3 and an output node of each peak amplifier 4 are connected to a load connection node n1 via the N number of output networks 6. Load resistance $R_{LOAD}$ shared by the amplifiers 3 and 4 is connected to the load connection node n1. The main amplifier 3 performs a signal amplification operation. The main amplifier 3 always performs an amplification operation while a signal is being input thereto. The signal input to the main amplifier 3 is one of the signals that an input signal of the input splitter 2 shown in FIG. 2 is split into the N number of signals by the input splitter 2 to be input to the N number of input networks 5, and then is output from the N number of the input networks 5. When the output voltage and current of the main amplifier 3 are denoted as $V_M$ and $I_M$, respectively, the main amplifier 3 is expressed equivalently as having a current source that feeds a current obtained by phase shifting by $-j\times(N-2)$ with respect to the phase of a current flowing through the rightmost peak amplifier 4 in FIG. 1.

The (N−1) number of peak amplifiers 4 perform an amplification operation in order in accordance with the signal amplitude while the main amplifier 3 is performing the amplification operation. In other words, in accordance with the signal amplitude, the number of peak amplifiers 4 that perform the amplification operation changes. The greater the signal amplitude is, the number of peak amplifiers 4 that perform the amplification operation increases more. In this way, the signal amplification operation can be performed efficiently to reduce power consumption.

In more specifically, among the (N−1) number of peak amplifiers 4 shown in FIG. 1, the rightmost peak amplifier 4 performs the amplification operation at first and then the other peak amplifiers 4 start the amplification operation in order from the rightmost to the leftmost as the amplitude of signals input to the peak amplifiers 4 becomes greater.

The output currents flowing through the (N−1) number of peaks amplifiers 4 are different in phase. With respect to the phase of a current flowing through the rightmost peak amplifier 4, the phase of a current flowing through the leftmost peak amplifier 4 on the right side of the main amplifier 3 is shifted by $-j\times(N-2)$ like the main amplifier 3, and the phase of a current flowing through the peak amplifier 4 on the right side of the leftmost peak amplifier 4 is shifted by $-j\times(N-3)$. Accordingly, each peak amplifier 4 is expressed equivalently as having a current source that feeds a current of its inherent phase. The phase difference among the currents is caused in FIG. 2 by splitting the input signal by the input splitter 2 to a plurality of input networks 5.

The N number of input networks 5 are situated between an input terminal of the input splitter 2 to which an input signal is input and an input node of the main amplifier 3 and also between the above-described input terminal and each input node of the (N−1) number of peak amplifiers 4. A design is made on the phase shift amount so that a phase shift amount between the above-described input terminal and the load connection node n1 via the main amplifier 3 using one of the N number of input networks 5, is equal to a phase shift amount between the above-described input terminal and the load connection node n1 via one of the peak amplifiers 4 using the input network 5 connected to the one peak amplifier 4 in question. Such a design can be performed by adjusting circuitry (for example, electrical length and width of a microstrip line) that configures each input network 5.

The N number of output networks 6 are situated between an output node of the main amplifier 3 and the load connection node n1 and also between outputs node of the (N−1) number of peak amplifiers 4 and the connection node n1. The output networks 6 can be realized, but not limited to, using circuitry such as microstrip line, LC circuitry, etc. where each circuitry can uniquely control the harmonic impedances. The controllable harmonic impedance means that each circuitry (for example, electrical length and width of a microstrip line) can be adjusted separately. For example, the electrical lengths of the N number of output networks 6 are adjusted separately so that the transfer characteristics at a signal fundamental frequency, at the second harmonic frequency, and at the third harmonic frequency become ideal characteristics.

The first bias network 7 supplies a D.C. bias voltage to the main amplifier 3 and to at least one of the output nodes of the (N−1) number of peak amplifiers 4, that is, to at least one of the N number of output networks 6. The D.C. bias voltage is supplied from the D.C. power supply 9 shown in FIG. 1.

FIG. 1 shows an example in which the first bias network 7 is connected to the output node of the main amplifier 3. However, the first bias network 7 may be connected to the output node of any of the (N−1) number of peak amplifiers 4. For example, in the case where a plurality of first bias networks 7 are connected to the plurality of output networks 6, respectively, a single D.C. voltage is supplied to any of the first bias networks 7. In this way, it is not necessary to provide a plurality of bias power supplies, which simplifies the circuit configuration of the amplifier 1.

Circuit elements such as transistors that configure the main amplifier 3 and the (N−1) number of peak amplifiers 4 have parasitic components. In FIG. 1, parasitic components at the output node of each amplifier are equivalently represented with a shunt capacitor and a series inductor. For example, the shunt capacitor and the series inductor of the main amplifier 3 are denoted as $C_M$ and $L_M$, respectively, the shunt capacitor and the series inductor of the rightmost peak amplifier 4 are denoted as $C_{P1}$ and $L_{P1}$, respectively, and the shunt capacitor and the series inductor of the leftmost peak amplifier 4 are denoted as $C_{P(N-1)}$ and $LP_{(N-1)}$, respectively.

In the amplifier 1 of FIGS. 1 and 2, the first bias network 7 connected to the output node of the main amplifier 3 is circuitry of an electrical length less than 90 degrees. This circuitry supplies the D.C. bias voltage to the main amplifier 3 and to the N number of output networks 6 connected to all of the output nodes of the (N−1) number of peak amplifiers 4, and controls the harmonic impedance of the amplifiers 3 and 4.

Moreover, in the amplifier 1 of FIGS. 1 and 2, the electrical lengths of the N number of output networks 6 are adjusted separately to be greater or less than 90 degrees, for desired amplification operations. For example, in the case of a 3-way Doherty amplifier 1, the electrical length of circuitry T1 is adjusted to be greater than 90 degrees, and the electrical lengths of circuitry T2 and T3 are adjusted to be less than 90 degrees, to achieve desired amplification performance. A plurality of first bias networks 7 may be connected to the main amplifier 3 and to the output nodes of any of two or more of the peak amplifiers, respectively. In this case, a single D.C. voltage is supplied to any of the first bias networks 7.

Figure 3:
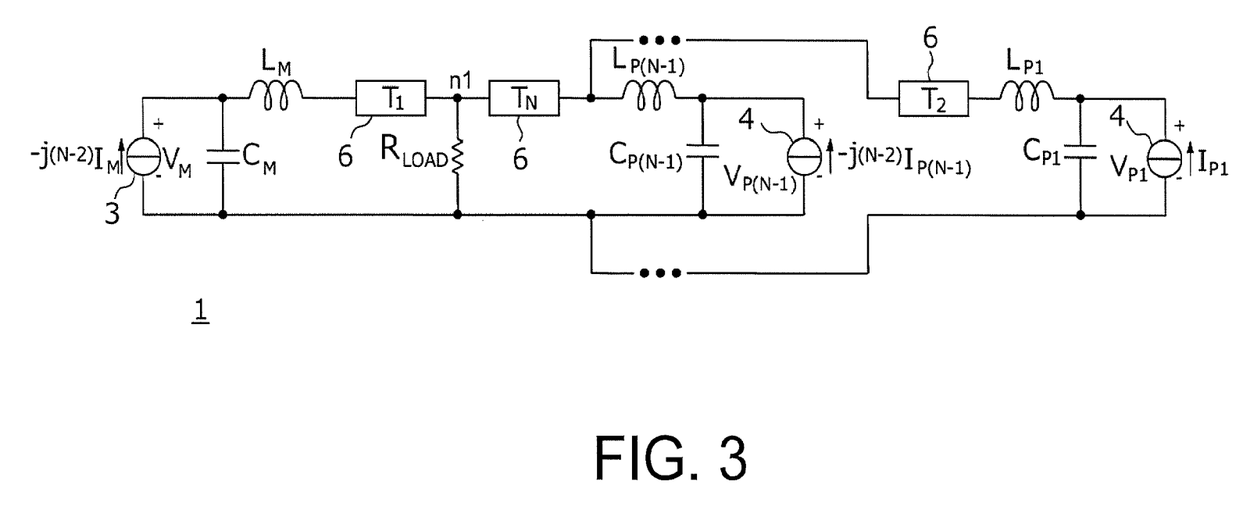
FIG. 3 is an equivalent circuit diagram of an amplifier according to a comparative example.

FIG. 3 is an equivalent circuit diagram of an amplifier 1 according to a comparative example. In FIG. 3, different from FIG. 1, the first bias network 7 is not provided. The electrical lengths of the N number of output networks 6 of FIG. 3 are all 90 degrees. The output-current phase of each peak amplifier 4 is set to become a balanced phase. The optimum balanced phase in the amplifier 1 of FIG. 3 is determined by the output node of each amplifier. Since parasitic components of transistors and the like that configure the amplifier 1 have a frequency and phase response, in the design of the N-way Doherty amplifier 1, the parasitic components are required to be taken into consideration. The parasitic components equivalently function to lengthen or shorten the circuitry electrical length, however, since an ideal amplifier 1 is assumed to have a circuitry electrical length of 90 degrees, there is a difference in amplification operation from an actual amplifier 1. Moreover, internal matching and package shape of the amplifier 1 become a cause for the amplification operation of the actual amplifier 1 not to be ideal amplification operation.

By contrast, in the present embodiment, as shown in FIG. 1, the first bias network 7 that supplies a single D.C. bias voltage is connected, for example, to the output node of the main amplifier 3, with the electrical length of the first bias network 7 being set to be less than 90 degrees and the electrical lengths of the N number of output networks 6 being separately adjusted to be greater or less than 90 degrees. In this way, the parasitic components at the output node of each amplifier can be compensated for.

Figure 4A:
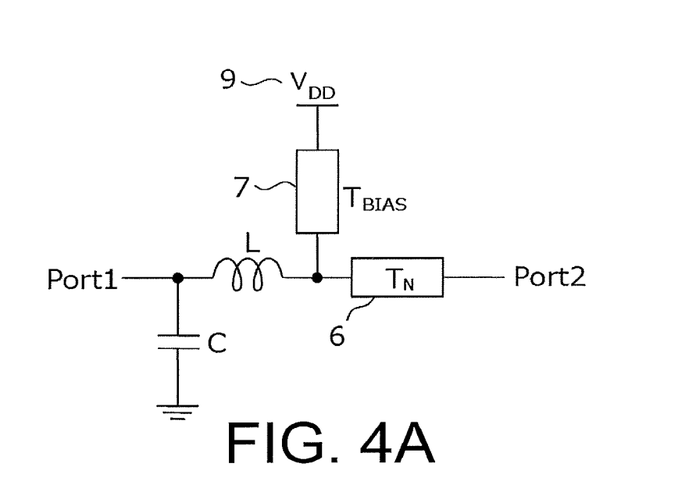
FIG. 4A is a circuit diagram showing the basic configuration of a main amplifier of the amplifier in FIG. 1.
Figure 4B:
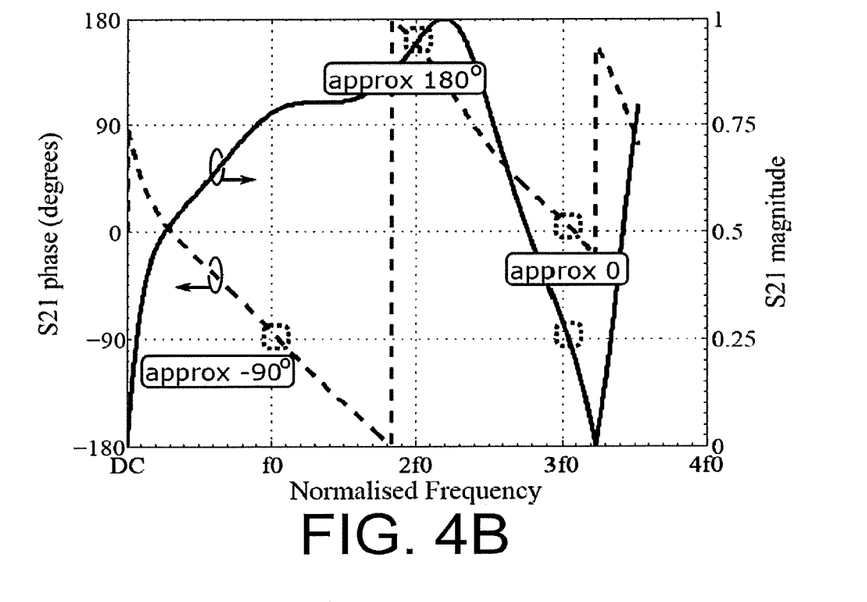
FIG. 4B is a graph showing phase change of S21 over frequency and amplitude change of S21 over frequency in the circuitry of FIG. 4A.
Figure 4C:
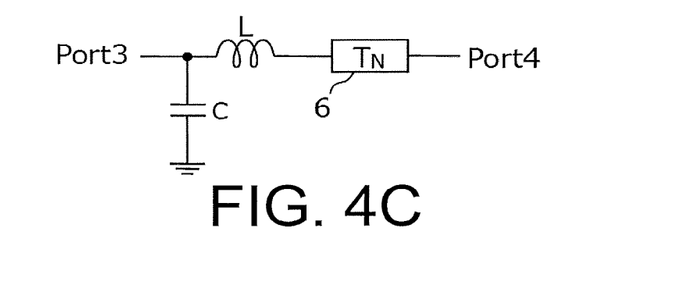
FIG. 4C is a circuit diagram showing the basic configuration of a peak amplifier of the amplifier in FIG. 1.

FIGS. 4A and 4B are figures showing the characteristics of the main amplifier 3 in the amplifier 1 of FIG. 1. FIG. 4A is a circuit diagram showing the basic configuration of the main amplifier 3 of the amplifier 1 in FIG. 1. FIG. 4B is a graph showing phase and amplitude change over frequency of an S-parameter S21 (through) in the circuitry of FIG. 4A. The graph shows how to control the second and third harmonic impedances while performing an amplification operation close to that of an ideal N-way Doherty amplifier 1. FIG. 4C is a circuit diagram showing the basic configuration of each peak amplifier 4 in the amplifier 1 of FIG. 1.

In the circuitry of FIG. 4A, as parasitic components, a shunt capacitor C and a series inductor L are connected to a Port 1. To the output of the series inductor L, a Port2 is connected via an output network 6T1, and also a first bias network 7 that supplies a D.C. bias voltage $V_{DD}$ is connected. The electrical length of the first bias network 7 is set to be less than 90 degrees. The Port 2 is equivalent to the load connection node n1 of FIG. 1.

FIG. 4B shows a graph close to ideal characteristics of the circuitry of FIG. 4A. As understood from the graph, the phase of S21 at the fundamental frequency is about −90 degrees, with an amplitude of about 0.75. The phase at the fundamental frequency is set to −90 degrees by interaction of the parasitic components C and L, the first bias network 7, and the output network 6.

The phase of S21 at the second harmonic is about 180 degrees, with an amplitude of about 1. The phase and amplitude of S21 at the third harmonic are minimized to about 0 and about 0.5, respectively. The characteristics of the graph are obtained by adjustment to make the electrical length of the output network 6 greater or less than 90 degrees. Accordingly, the phase difference between the Ports 1 and 2 at the fundamental frequency is 90 degrees, the phase difference between the Ports 1 and 2 at the second harmonic is 180 degrees, and the phase difference between the Ports 1 and 2 at the third harmonic is 0 degrees.

As understood from the graph of FIG. 4B, the first bias network 7 having an electrical length less than 90 degrees is connected to the main amplifier 3 or at the output node of the peak amplifier 4, to supply a single D.C. bias voltage to the output network 6, with adjustment to the electrical length of the output network 6 to be greater or less than 90 degrees, which achieves an amplification operation close to an ideal operation with consideration of parasitic components.

However, harmonic control is not enough only by providing the N number of output networks 6 and the first bias network 7. In order to perform harmonic control at high accuracy, further ideas on circuitry are required.

Figure 5:
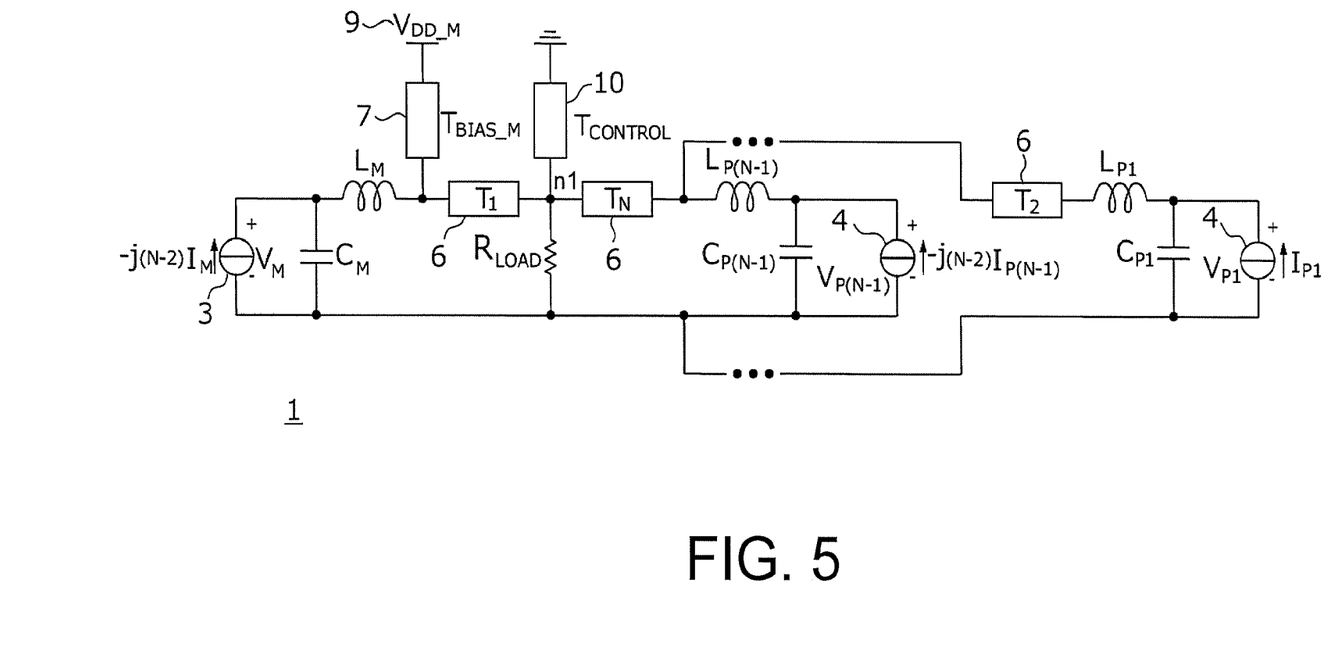
FIG. 5 is an amplifier for which a second bias network is added to the circuitry of FIG. 1.
Figure 6A:
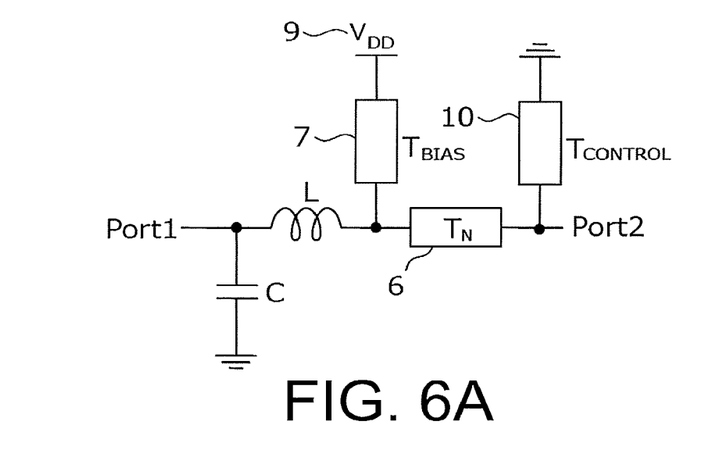
FIG. 6A is a circuit diagram showing the basic configuration of a main amplifier of the amplifier of FIG. 5.
Figure 6B:
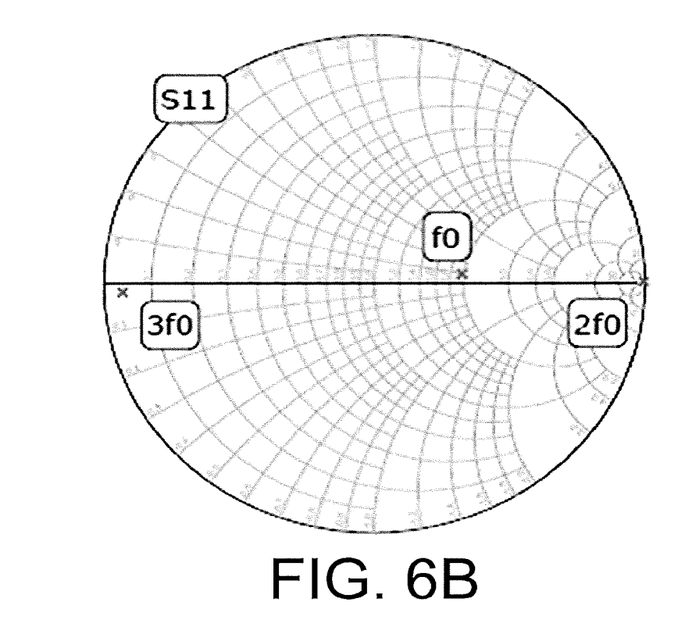
FIG. 6B is a Smith chart showing the S11 parameter of the circuitry of FIG. 6A.

In FIG. 5, a second bias network 10 is added to the circuitry of FIG. 1. The second bias network 10 is circuitry for performing bias supply, for example, at the same level as the ground level to the load connection node n1. Although one end of the second bias network 10 may not necessary be set to the ground level, since the present embodiment is unique in use of a single D.C. bias voltage, the one end of the second bias network 10 is made conductive to a solid ground pattern to simplify the circuitry configuration. As described, there is a unique point in that the second bias network 10 performs biasing at a different voltage level from the first bias network 7. The second bias network 10 is provided to control the harmonics of the main amplifier 3 and the (N−1) number of peak amplifiers 4. The second bias network 10 may be realized with a transmission line, such as the output network 6, or lumped constant parts such as a coil and a capacitor, a waveguide, or a combination thereof, in the same manner as other networks, FIGS. 6A and 6B are figures showing the characteristics of the main amplifier 3 in the amplifier 1 of FIG. 5. FIG. 6A is a circuit diagram showing the basic configuration of the main amplifier 3 of the amplifier 1 in FIG. 5. FIG. 6B is a Smith chart showing the 511 parameters of the circuitry of FIG. 6A. The circuitry of FIG. 6A has the second bias network 10 added to the circuitry of FIG. 4A. One end of the second bias network 10 is set to a ground voltage, the other end thereof being connected to a Port 2. In the same manner as the circuitry of FIG. 4A, in the circuitry of FIG. 6A, the electrical length of the first bias network 7 is set to a value less than 90 degrees, whereas the electrical length of the output network 6 is set to a value greater or less than 90 degrees. The electrical length of the second bias network 10 is set, for example, to 90 degrees, when its one end is set to the ground level.

As understood from the Smith chart of FIG. 6B, in the circuitry of FIG. 6A, by adjusting the electrical length of the output network 6 to be greater or less than 90 degrees, the fundamental frequency f0, the second harmonic 2f0, and the third harmonic 3f0 are aligned in an almost straight line. In more specifically, the second harmonic 2f0 is situated on the right side of the Smith chart, having a value like open circuitry. Or the third harmonic 3f0 is situated on the left side of the Smith chart, having a value like short circuitry. Accordingly, the amplifier 1 of FIGS. 5 and 6A performs ideal amplification operation.

Figure 7:
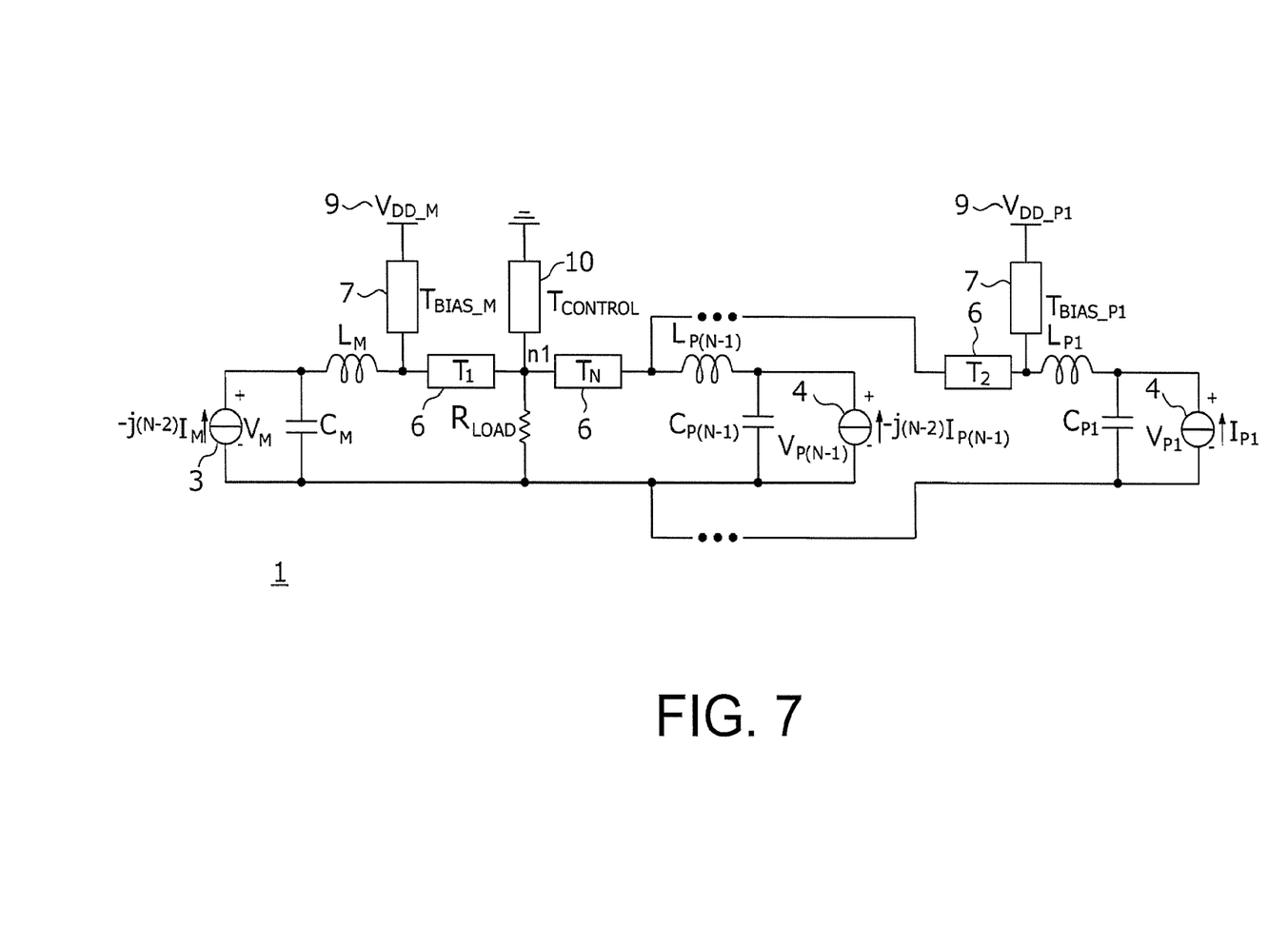
FIG. 7 is an amplifier in which a first bias network is connected to an output node of the rightmost peak amplifier.

Although, in the amplifiers 1 of FIGS. 1 and 5, the first bias network 7 is not connected in a symmetrical manner, by connecting the first bias network 7 in the symmetrical manner, a further ideal amplification operation can be performed. In FIG. 7, in addition to the configuration of the amplifier 1 of FIG. 5, a first bias network 7 is also connected to the output node of the rightmost peak amplifier 4. In the case of FIG. 7, since the first bias networks 7 are connected to the amplifier 3 and the peak amplifier 4 at the leftmost and rightmost sides, respectively, the circuitry of FIG. 7 is excellent in symmetry and a further ideal amplification operation is performed.

Figure 8:
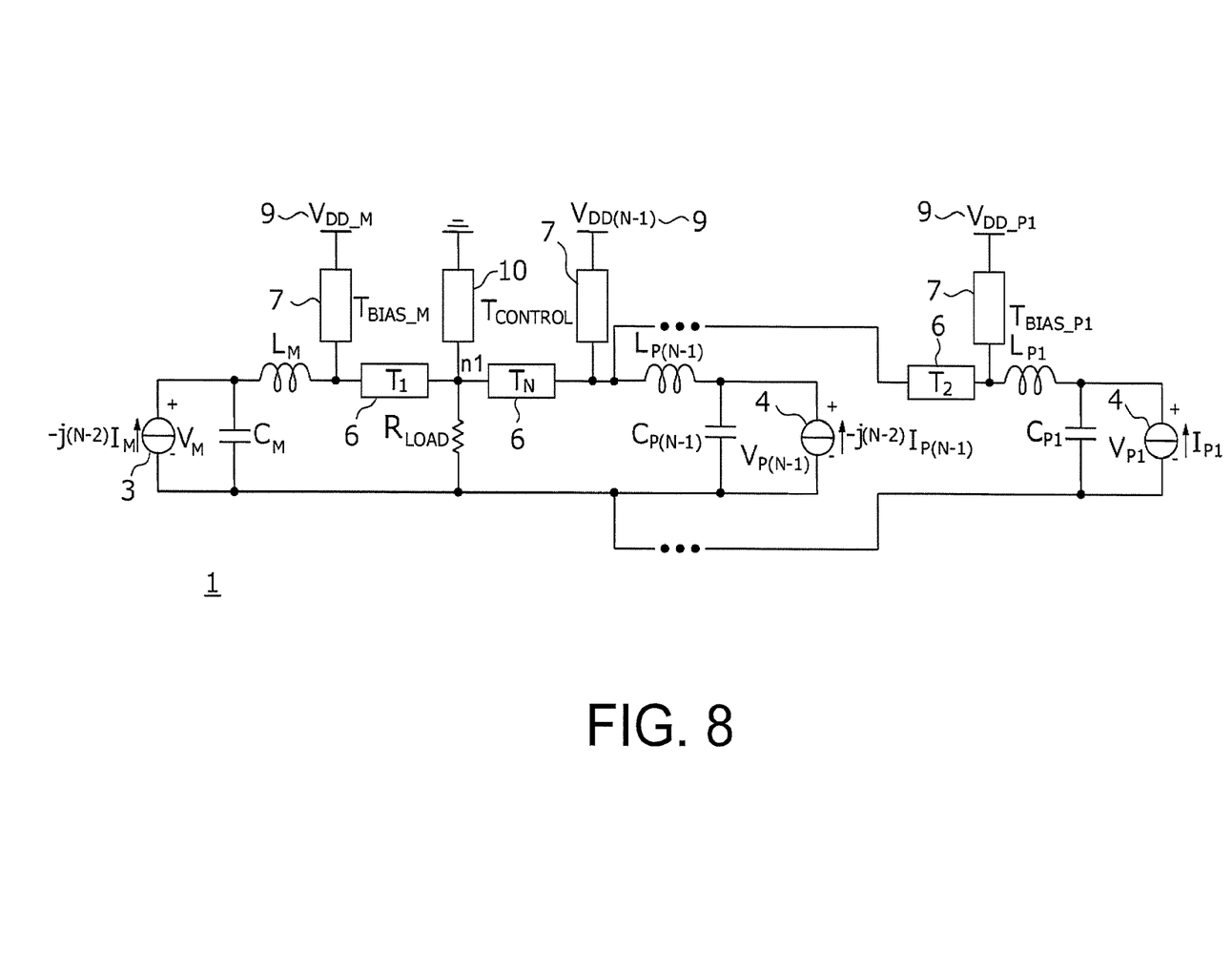
FIG. 8 is an amplifier in which first bias networks are connected to output nodes of peak amplifiers, in addition to the leftmost and rightmost peak amplifiers.

In FIG. 8, in addition to the configuration of the amplifier 1 of FIG. 7, first bias networks 7 are further connected to the output nodes of peak amplifiers 4, in addition to the leftmost and rightmost peak amplifiers. In the amplifier 1 of FIG. 8, since the number of first bias networks 7 connected to the output nodes of the peak amplifiers 4, respectively, is increased, parasitic components of the output nodes of the peak amplifiers 4 can be compensated for accurately, and harmonic impedance control can also be performed accurately, so that, compared to the circuitry of FIG. 7, a further ideal amplification operation can be performed.

Figure 9:
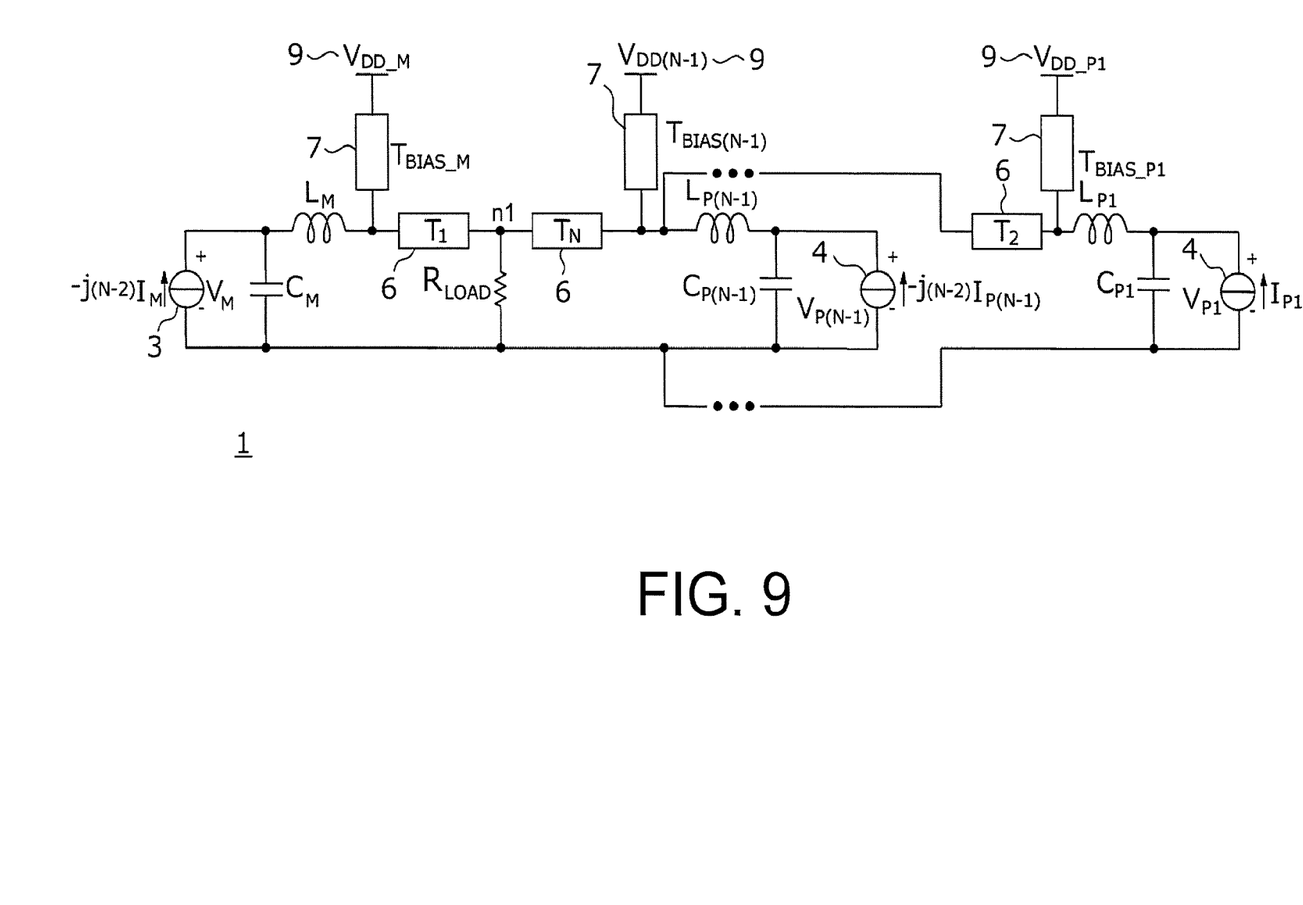
FIG. 9 is an amplifier for which a second bias network is omitted in FIG. 8.
Figure 10:
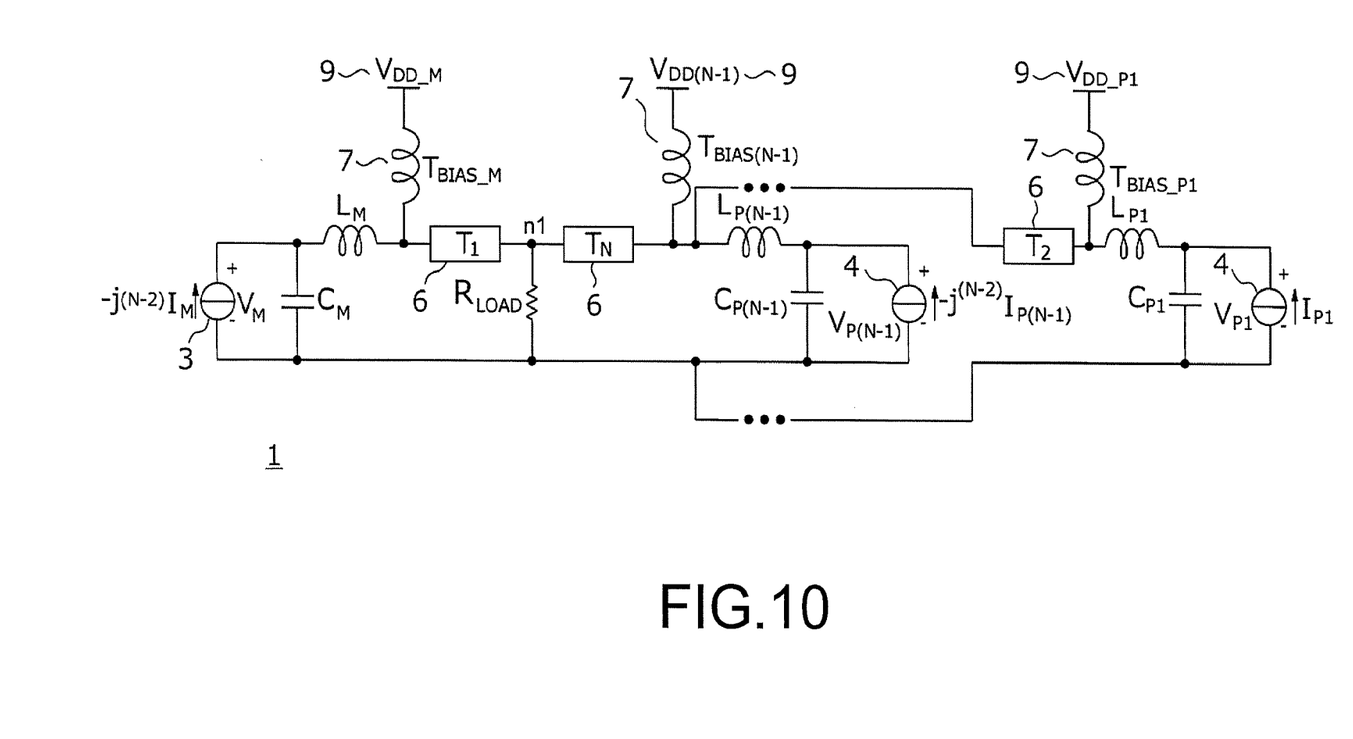
FIG. 10 is an amplifier in which an inductor is provided as a bias network.

Although the amplifiers 1 of FIGS. 7 and 8 are provided with the second bias network 10, as shown in FIG. 9, the second bias network 10 may be omitted. Moreover, although in the examples of the amplifiers 1 described above, the first bias network 7 is configured with a transmission line such as a microstrip line, the first bias network 7 may be a lumped element inductor as shown in FIG. 10.

In the examples of the amplifiers 1 in FIGS. 1, and 5 to 10, electrical lengths of the N number of output networks 6, the first bias network 7, and the second bias network 10 are adjusted. Not only the electrical lengths, but the widths of the N number of output networks 6, the first bias network 7, and the second bias network 10 may be adjusted. By adjusting the widths, the impedance characteristics thereof listed up above can be adjusted to make the amplification operation of the amplifier 1 close to an ideal one.

Figure 11:
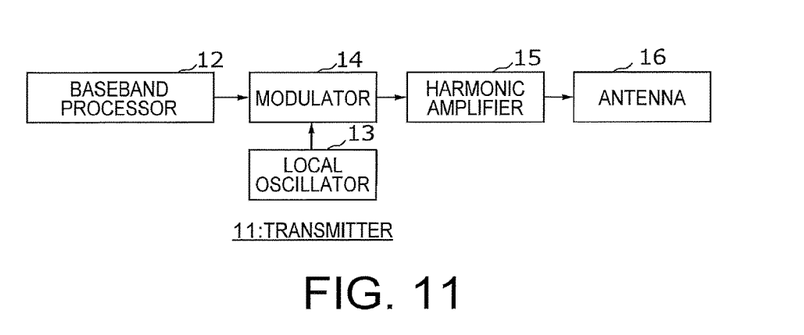
FIG. 11 is a block diagram showing an example of the internal configuration of a transmitter.

Although there is no particular limitation on the use of the amplifier 1 according to the above-described present embodiment, the amplifier 1 can, for example, be used in a transmitter. FIG. 11 is a block diagram showing an example of the internal configuration of a transmitter 11. The transmitter 11 of FIG. 11 is provided with a baseband processor 12, a local oscillator 13, a modulator 14, a harmonic amplifier 15, and an antenna 16. The baseband processor 12 performs signal processing to a baseband signal. The local oscillator 13 generates a local oscillation signal. The modulator 14 uses the local oscillation signal to modulate the baseband signal to generate a high-frequency signal. The harmonic amplifier 15 amplifies the high-frequency signal and transmits the amplified high-frequency signal to the antenna 16. The amplifiers 1 shown in the above-described FIGS. 1 and 5 to 10 can be used in the harmonic amplifier 15.

In FIG. 1 and the other figures, although the D.C. bias voltage supplied to one end of the first bias network 7 is represented with different signs for the respective first bias networks 7, as described above, in the present embodiment, a single D.C. bias voltage can be supplied. However, in some cases, D.C. bias voltages of different voltage levels may be supplied to a plurality of first bias networks 7, respectively.

As described above, in the present embodiment, the parasitic components of circuit elements that configure each amplifier in the amplifier 1 are compensated for and the harmonic impedance is controlled, so that the amplifier 1 can perform an amplification operation close to an ideal amplification operation. Accordingly, average power efficiency of a signal in a wide dynamic range can be improved. Moreover, since a single D.C. bias voltage is used, it is enough to provide a single D.C. power supply 9 and hence the entire configuration of the amplifier 1 can be simplified.

In more specifically, in the present embodiment, the electrical length of the first bias network 7 of the output network 6 is adjusted to perform parasitic component compensation and harmonic impedance control, so that, without a complex circuit configuration, the amplifier 1 can perform an ideal amplification operation. Moreover, by providing the second bias network 10, harmonic impedance control can further be performed accurately.

As described, by controlling the harmonic impedance, the performance of transistors used in the amplifier 1 can be improved. Moreover, although it takes much time to make an analysis of and to take measures against transistor parasitic components, according to the present embodiment, the effect of the transistor parasitic components can be compensated for accurately.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An amplifier comprising:
an N number of input networks connected to an input terminal to receive an input signal;
a first amplifier to amplify one output signal from the N number of input networks;
a (N−1) number, N being an integer of three or more, of second amplifiers to amplify the remaining (N−1) number of output signals, from the N number of input networks, in accordance with amplitudes of output signals from the N number of input networks while the first amplifier is performing an amplification operation;
an N number of output networks which are situated between an output node of the first amplifier and a load connection node, and also connected between output nodes of the (N−1) number of second amplifiers and the load connection node; and
a first bias network to supply a D.C. bias voltage to at least one of the N number of output networks,
wherein an electrical length of the first bias network is less than 90 degrees, and
a phase shift amount between the input terminal and the load connection node in a passage via the first amplifier using one input network among the N number of input networks, is equal to a phase shift amount between the input terminal and the load connection node via a passage of any secondary amplifier using the input network connected to the amplifier in question.

2. The amplifier of claim 1, wherein the N number of output networks comprise a harmonic-impedance controllable network.

3. The amplifier of claim 2, wherein electrical lengths of the N number of output networks are adjusted, separately, and
the electrical lengths of the N number of output networks are adjusted to be greater or less than 90 degrees.

4. The amplifier of claim 3, wherein the electrical lengths of the N number of output networks are adjusted separately so that transfer characteristics at a fundamental frequency of the input signal, at a second harmonic frequency, and at a third harmonic frequency become ideal characteristics.

5. The amplifier of claim 1 further comprising a plurality of first bias networks, connected to two or more of the N number of output networks,
wherein the D.C. bias voltage of a same level is supplied to one end of each of the plurality of first bias networks.

6. The amplifier of claim 1 further comprising a second bias network to perform bias setting of a different voltage level from the first bias network, to the load connection node.

7. The amplifier of claim 6, wherein the second bias network performs harmonic impedance control to the N number of output networks.

8. The amplifier of claim 6, wherein an end of the second bias network is set to a ground level.

9. The amplifier of claim 6, wherein electrical lengths and widths of the N number of output networks, the first bias network, and the second bias network are adjusted separately.

10. A transmitter comprising:
a baseband processor to perform signal processing to a baseband signal;
a modulator to modulate the baseband signal by using a local oscillation signal to generate a high-frequency signal; and a harmonic amplifier to amplify the high-frequency signal and transmit the amplified high-frequency signal to an antenna;

wherein the harmonic amplifier comprises:

an N number of input networks connected to an input terminal to receive an input signal;

a first amplifier to amplify one output signal from the N number of input networks;

a (N−1) number, N being an integer of three or more, of second amplifiers to amplify the (N−1) number of output signals, except for the one output signal, from the N number of input networks, in accordance with amplitudes of output signals from the N number of input networks while the first amplifier is performing an amplification operation;

an N number of output networks connected between an output node of the first amplifier and a load connection node, and also connected between output nodes of the (N−1) number of second amplifiers and the load connection node; and a first bias network to supply a D.C. bias voltage to at least one of the N number of output networks, wherein an electrical length of the first bias network is less than 90 degrees, and a phase shift amount between the input terminal and the load connection node in a passage to the first amplifier via a one input network among the N number of input networks, is equal to a phase shift amount between the input terminal and the load connection node in a passage to any secondary amplifier via the input network connected to the secondary amplifier in question.

11. The transmitter of claim 10, wherein the N number of output networks comprise a harmonic-impedance controllable network.

12. The transmitter of claim 11, wherein electrical lengths of the N number of output networks are adjusted, separately, and the electrical lengths of the N number of output networks are adjusted to be greater or less than 90 degrees.

13. The transmitter of claim 12, wherein the electrical lengths of the N number of output networks are adjusted separately so that transfer characteristics at a fundamental frequency of the input signal, at a second harmonic frequency, and at a third harmonic frequency become ideal characteristics.

14. The transmitter of claim 10 further comprising a plurality of first bias networks, connected to two or more of the N number of output networks, wherein the D.C. bias voltage of a same level is supplied to one end of each of the plurality of first bias networks.

15. The transmitter of claim 10 further comprising a second bias network to perform bias setting of a different voltage level from the first bias network, to the load connection node.

16. The transmitter of claim 15, wherein the second bias network performs harmonic impedance control to the N number of output networks.

17. The transmitter of claim 15, wherein an end of the second bias network is set to a ground level.

18. The transmitter of claim 15, wherein electrical lengths and widths of the N number of output networks, the first bias network, and the second bias network are adjusted separately.

* * * * *